United States Patent
Mancoff et al.

(10) Patent No.: US 7,149,106 B2
(45) Date of Patent: Dec. 12, 2006

(54) SPIN-TRANSFER BASED MRAM USING ANGULAR-DEPENDENT SELECTIVITY

(75) Inventors: Frederick B. Mancoff, Tempe, AZ (US); Bradley N. Engel, Chandler, AZ (US); Nicholas D. Rizzo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 11 days.

(21) Appl. No.: 10/971,741

(22) Filed: Oct. 22, 2004

(65) Prior Publication Data

US 2006/0087880 A1    Apr. 27, 2006

(51) Int. Cl.
*G11C 11/00* (2006.01)

(52) U.S. Cl. .................. 365/158; 365/171; 365/173

(58) Field of Classification Search .......... 365/158, 365/171, 173
See application file for complete search history.

(56) References Cited

U.S. PATENT DOCUMENTS

| | | | |
|---|---|---|---|
| 5,695,864 A | 12/1997 | Slonczewski et al. | |
| 6,603,677 B1 * | 8/2003 | Redon et al. | 365/158 |
| 6,865,109 B1 * | 3/2005 | Covington | 365/173 |

OTHER PUBLICATIONS

F.B. Mancoff, R.W. Dave, N.D. Rizzo, T.C. Eschrich, B.N. Engel, S. Tehrani; Angular Dependence of Spin-Transfer Switching in a Magnetic Nanostructure; Applied Physics Letters; vol. 83; Nov. 8, 2003; 3 pages.

E.B. Meyers, D.C. Ralph, J.A. Katine, R.N. Louie, R.A. Buhrman; Current-Induced Switching of Domains in Magnetic Multiplayer Devices; Science; vol. 285; Aug. 6, 1999; 4 pages.

* cited by examiner

*Primary Examiner*—Son T. Dinh
(74) *Attorney, Agent, or Firm*—Ingrassia, Fisher & Lorenz

(57) ABSTRACT

A magnetic random access memory ("MRAM") device can be selectively written using spin-transfer reflection mode techniques. Selectivity of a designated MRAM cell within an MRAM array is achieved by the dependence of the spin-transfer switching current on the relative angle between the magnetizations of the polarizer element and the free magnetic element in the MRAM cell. The polarizer element has a variable magnetization that can be altered in response to the application of a current, e.g., a digit line current. When the magnetization of the polarizer element is in the natural default orientation, the data in the MRAM cell is preserved. When the magnetization of the polarizer element is switched, the data in the MRAM cell can be written in response to the application of a relatively low write current.

20 Claims, 6 Drawing Sheets

SPIN-TRANSFER BASED MRAM USING ANGULAR-DEPENDENT SELECTIVITY

STATEMENT REGARDING FEDERALLY SPONSORED RESEARCH

This invention was made with Government support under Agreement No. MDA972-01-3-2004 awarded by DARPA. The Government has certain rights in the invention.

TECHNICAL FIELD

The present invention generally relates to magnetic random access memory ("MRAM") devices, and more particularly relates to spin-transfer based MRAM devices.

BACKGROUND

MRAM is a nonvolatile memory technology that uses magnetization to represent stored data, in contrast to older RAM technologies that use electronic charges to store data. One primary benefit of MRAM is that it retains the stored data in the absence of electricity, i.e., it is a nonvolatile memory. Generally, MRAM includes a large number of magnetic cells formed on a semiconductor substrate, where each cell represents one data bit. A bit is written to a cell by changing the magnetization direction of a magnetic element within the cell, and a bit is read by measuring the resistance of the cell (low resistance typically represents a "0" bit and high resistance typically represents a "1" bit).

FIG. 1 is a schematic perspective view of a simplified MRAM device 100, and FIG. 2 and FIG. 3 are schematic perspective views of a simplified MRAM cell 102. Although MRAM device 100 includes only nine cells 102, a practical MRAM device will typically include millions of cells. Generally, cell 102 includes an upper ferromagnetic layer 104, a lower ferromagnetic layer 106, and an insulating layer 108 between the two ferromagnetic layers. In this example, upper ferromagnetic layer 104 is the free magnetic layer because the direction of its magnetization can be switched to change the bit status of cell 102. Lower ferromagnetic layer 106, however, is the fixed magnetic layer because the direction of its magnetization does not change. When the magnetization in upper ferromagnetic layer 104 is parallel to the magnetization in lower ferromagnetic layer 106 (see FIG. 2), the resistance across cell 102 is relatively low. When the magnetization in upper ferromagnetic layer 104 is anti-parallel to the magnetization in lower ferromagnetic layer 106 (see FIG. 3), the resistance across cell 102 is relatively high. The data ("0" or "1") in a given cell 102 is read by measuring the resistance of the cell 102. In this regard, electrical conductors 110/112 attached to the cells 102 are utilized to read the MRAM data.

FIG. 4 is a schematic representation of a conventional switching technique for an MRAM cell 120 having a free magnetic layer 122, an insulating layer 124, and a fixed magnetic layer 126. The orientation of magnetization in free magnetic layer 122 can point in one of two directions (left or right in FIG. 4), while the orientation of fixed magnetic layer 126 can only point in one direction (right in FIG. 4). The orientation of the magnetization in free magnetic layer 122 rotates in response to current 127 flowing in a digit line 128 and in response to current 129 flowing in a write line 130. FIG. 4 depicts the situation where the current in digit line 128 is flowing out of the page, and the current in write line 130 is flowing from left to right, which will cause the magnetization in free magnetic layer 122 to switch from parallel to anti-parallel to the magnetization in fixed magnetic layer 126. In a typical MRAM, the orientation of the bit is switched by reversing the polarity of the current 129 in the write line 130 while keeping a constant polarity of the current 127 in the digit line 128.

The traditional MRAM switching technique depicted in FIG. 4 has some practical limitations, particularly when the design calls for scaling the bit cell to smaller dimensions. For example, since this technique requires two sets of magnetic field write lines, the array of MRAM cells is susceptible to bit disturbs (i.e., neighboring cells may be unintentionally altered in response to the write current directed to a given cell). Furthermore, decreasing the physical size of the MRAM cells results in lower magnetic stability against magnetization switching due to thermal fluctuations. The stability of the bit can be enhanced by utilizing a magnetic material for the free layer with a large magnetic anisotropy and therefore a large switching field, but then the currents required to generate a magnetic field strong enough to switch the bit are impractical in real applications.

Transmission mode spin-transfer switching is another technique for writing MRAM bit data. Writing bits using the spin-transfer interaction can be desirable because bits with a large coercivity (Hc) in terms of magnetic field induced switching (close to 1000 Oe) can be switched using only a modest current, e.g., less than 5 mA. The higher Hc results in greater thermal stability and less possibility for disturbs. FIG. 5 is a schematic representation of a transmission mode spin-transfer switching technique for an MRAM cell 150 having a first magnetic layer 152, a nonmagnetic layer 154, and a second magnetic layer 156. In this technique, the write current 157 actually flows through cell 150 (with the arrow representing the direction of the electron flow). According to the spin-transfer effect, the electrons in the write current become spin-polarized after they pass through first magnetic layer 152. In this regard, first magnetic layer 152 functions as a polarizer. The spin-polarized electrons cross the nonmagnetic layer 154 and, through conservation of angular momentum, impart a torque on second magnetic layer 156. This torque causes the orientation of magnetization in second magnetic layer 156 to be parallel to the orientation of magnetization in first magnetic layer 152. The parallel magnetizations will remain stable until a write current of opposite direction switches the orientation of magnetization in second magnetic layer 156 to be anti-parallel to the orientation of magnetization in first magnetic layer 152.

The transmission mode spin-transfer switching technique requires relatively low power (compared to the conventional switching technique), virtually eliminates the problem of bit disturbs, results in improved data retention, and is desirable for small scale applications. In practice, however, this technique is difficult to implement in a memory array because the write current must flow through the magnetic tunnel junction embodied in the cell. This negatively affects reliability of the MRAM cells and requires the use of larger write transistors at each bit location that are capable of producing the necessary currents, which is incompatible with high-density applications.

Accordingly, it would be desirable to have a practical MRAM architecture that enables an ultra-dense, low power, MRAM device. In addition, it would be desirable to have a practical and selective write technique for a spin-transfer based MRAM array, where the write current does not flow through the MRAM cells. Furthermore, other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
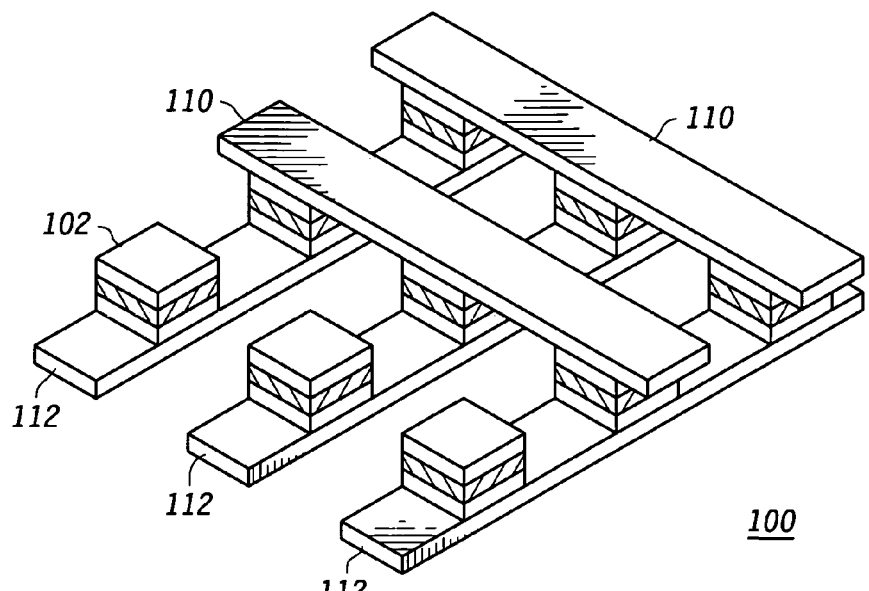
FIG. 1 is a schematic perspective view of a prior art MRAM device.
Figure 6:
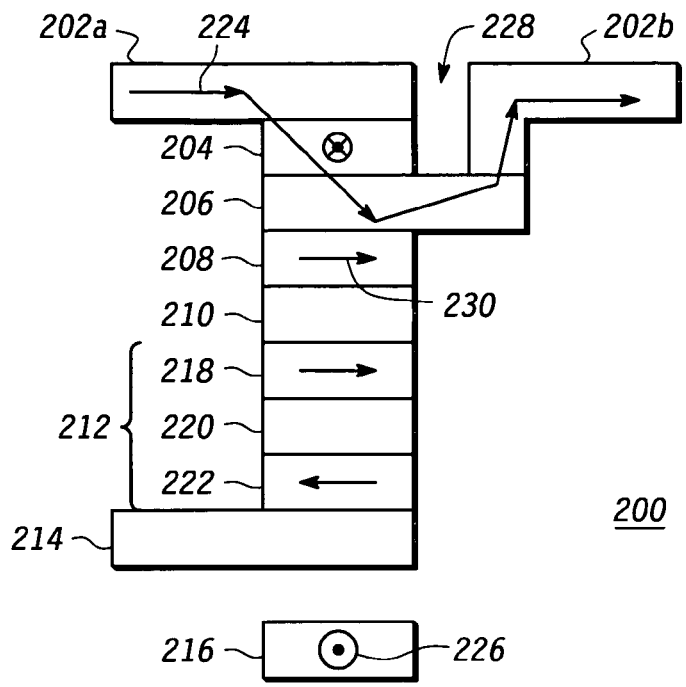
FIG. 6 is a side sectional view of an MRAM cell configured in accordance with an embodiment of the invention.

FIG. 6 is a side sectional view of an MRAM cell 200 configured in accordance with an embodiment of the invention. In practice, an MRAM architecture or device will include many MRAM cells 200, typically connected together in a matrix of columns and rows (see FIG. 1). MRAM cell 200 generally includes the following elements: a first conductor 202 which carries a write current 224; a magnetic polarizer 204; a spacer element 206; a free magnetic element 208; an insulator 210; a fixed magnet element 212; an electrode 214; and a second conductor 216 which carries a digit current 226. In this example embodiment, fixed magnet element 212 includes a fixed magnetic layer 218, a spacer layer 220, and a fixed magnetic layer 222. In a practical deployment, first conductor 202 may be connected to any number of similar MRAM cells (e.g., a column of cells) to provide a common write current 224 to each of the connected cells. Similarly, second conductor 216 may be associated with any number of similar MRAM cells (e.g., a row of cells) to provide a common digit current 226 to each of the cells. In FIG. 6, the direction of digit current 226 points out of the page.

First conductor 202 is formed from any suitable material capable of conducting electricity. For example, first conductor 202 may be formed from at least one of the elements Al, Cu, Au, Ag, or their combinations. In the example embodiment, first conductor 202 includes a first section 202a and a second section 202b separated by an air gap 228 or other suitable insulator. Air gap 228 ensures that write current 224 is diverted through magnetic polarizer 204 and spacer element 206 as schematically depicted in FIG. 6. In this regard, first section 202a is located above magnetic polarizer 204 and second section 202b is located above spacer element 206.

In the illustrated embodiment, magnetic polarizer 204 is located between spacer element 206 and first conductor 202. Magnetic polarizer 204 is formed from a magnetic material having a variable magnetization. For example, magnetic polarizer 204 may be formed from at least one of the elements Ni, Fe, Mn, Co, or their alloys as well as so-called half-metallic ferromagnets such as NiMnSb, PtMnSb, $Fe_3O_4$, or $CrO_2$. Magnetic polarizer 204 has a magnetic easy axis that defines a natural or "default" orientation of its magnetization. When MRAM cell 200 is in a steady state condition with no write current 224 or digit current 226 applied, the magnetization of magnetic polarizer 204 will naturally point along its easy axis. As described in more detail below, MRAM cell 200 is suitably configured to establish a particular easy axis direction for magnetic polarizer 204. From the perspective of FIG. 6, the easy ales of magnetic polarizer 204 point into and out of the page (in FIG. 6, the symbol located within magnetic polarizer 204 represents these easy axes). In contrast to conventional MRAM cells, magnetic polarizer 204 does not have a fixed magnetization. Rather, the magnetization of magnetic polarizer 204 is variable to facilitate improved writing of data to MRAM cell 200, as described in more detail below.

In the illustrated embodiment, spacer element 206 is located between magnetic polarizer 204 and free magnetic element 208. Spacer element 206 bridges air gap 228 to provide a conductive path between first section 202a and second section 202b of first conductor 202. Spacer element 206 is formed from an electrically conducting non-magnetic material. For example, spacer element 206 may be formed from a non-magnetic material such as copper or other metallic materials typically found in giant magnetoresistance spacers. As depicted in FIG. 6, write current 224 flows through spacer element 206 and back to first conductor 202 rather than through the much higher resistance path across the insulator 210.

Figure 2:
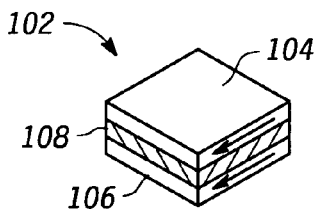
FIG. 2 is a schematic perspective view of a prior art MRAM cell in a first state.
Figure 3:
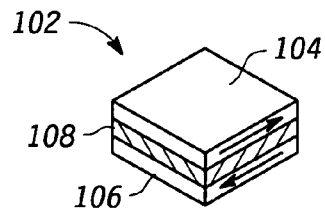
FIG. 3 is a schematic perspective view of a prior art MRAM cell in a second state.
Figure 4:
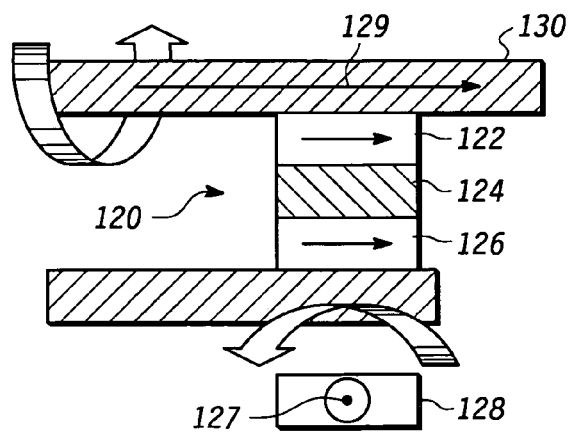
FIG. 4 is a side sectional view of a prior art MRAM cell, illustrating a switching technique for the MRAM cell.
Figure 5:
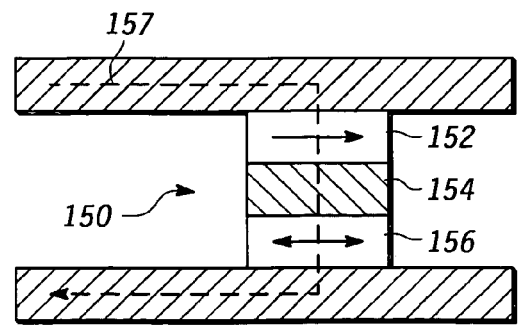
FIG. 5 is a side sectional view of a prior art MRAM cell, illustrating a transmission mode spin-transfer switching technique for the MRAM cell.

In the illustrated embodiment, free magnetic element 208 is located between spacer element 206 and insulator 210. Free magnetic element 208 is formed from a magnetic material having a variable magnetization. For example, free magnetic element 208 may be formed from at least one of the elements Ni, Fe, Mn, Co, or their alloys as well as so-called half-metallic ferromagnets such as NiMnSb, PtMnSb, $Fe_3O_4$, or $CrO_2$. As with conventional MRAM devices, the direction of the variable magnetization of free magnetic element 208 determines whether MRAM cell 200 represents a "1" bit or a "0" bit. In practice, the direction of the magnetization of free magnetic element 208 is either parallel or anti-parallel to the direction of the magnetization of fixed magnet element 212 (see the above explanation of FIG. 2 and FIG. 3).

Free magnetic element 208 has a magnetic easy axis that defines a natural or "default" orientation of its magnetization. When MRAM cell 200 is in a steady state condition with no write current 224 or digit current 226 applied, the magnetization of free magnetic element 208 will naturally point along its easy axis. As described in more detail below, MRAM cell 200 is suitably configured to establish a particular easy axis direction for free magnetic element 208. From the perspective of FIG. 6, the easy axis of free magnetic element 208 points either to the right or to the left (for example, in the direction of the arrow 230). In the preferred embodiment, the easy axis of free magnetic element 208 is orthogonal to the easy axis of magnetic polarizer 204. In practice, MRAM cell 200 utilizes anisotropy, such as shape or crystalline anisotropy, in magnetic polarizer 204 and free magnetic element 208 to achieve the orthogonal orientation of the respective easy axes.

In this example embodiment, insulator 210 is located between free magnetic element 208 and fixed magnet element 212. More specifically, insulator 210 is located between free magnetic element 208 and fixed magnetic layer 218. Insulator 210 is formed from any suitable material that can function as an electrical insulator. For example, insulator 210 may be formed from a material such as oxides or nitrides of at least one of Al, Mg, Si, Hf, Sr, or Ti. For purposes of MRAM cell 200, insulator 210 serves as a magnetic tunnel barrier element and the combination of free magnetic element 208, insulator 210, and fixed magnet element 212 form a magnetic tunnel junction.

In the illustrated embodiment, fixed magnet element 212 is located between insulator 210 and electrode 214. Fixed magnet element 212 has a fixed magnetization that is either parallel or anti-parallel to the magnetization of free magnetic element 208. In the practical embodiment, fixed magnet element 212 is realized as a pinned synthetic antiferromagnet having fixed magnetic layer 218, spacer layer 220, and fixed magnetic layer 222. As depicted in FIG. 6, fixed magnetic layer 218 and fixed magnetic layer 222 have anti-parallel magnetizations. Fixed magnetic layer 218 and fixed magnetic layer 222 may be formed from my suitable magnetic material, such as at least one of the elements Ni, Fe, Mn, Co, or their alloys as well as so-called half-metallic ferromagnets such as NiMnSb, PtMnSb, $Fe_3O_4$, or $CrO_2$. Spacer layer 220 is formed from any suitable nonmagnetic material, including at least one of the elements Ru, Os, Re, Cr, Rh, Cu, or their combinations. Synthetic antiferromagnet structures are known to those skilled in the art and, therefore, will not be described in detail herein.

Electrode 214 serves as the data read conductor for MRAM cell 200. In this regard, data in MRAM cell 200 can be read in accordance with conventional techniques: a small current flows through MRAM cell 200 and electrode 214, and that current is measured to determine whether the resistance of MRAM cell 200 is relatively high or relatively low. The read current is much smaller than the current required to switch the free layer by spin-transfer in order to avoid disturbs caused by reading the cell. In principle, the read signal will include contributions from the giant magnetoresistance across the spacer layer 206 as well as the tunneling magnetoresistance across the insulator 210. However, the tunneling magnetoresistance contribution will dominate the read signal due to the much higher resistivity across the insulator 210 compared to the resistivity across the metallic spacer layer 206. Electrode 214 is formed from any suitable material capable of conducting electricity. For example, electrode 214 may be formed from at least one of the elements Al, Cu, Au, Ag, Ta, or their combinations.

Second conductor 216 is formed from any suitable material capable of conducting electricity. For example, second conductor 216 may be formed from at least one of the elements Al, Cu, Au, Ag, or their combinations. As depicted in FIG. 6, second conductor 216 need not be in physical contact with electrode 214 (or any of the other elements of MRAM 200 shown in FIG. 6) because MRAM cell 200 utilizes the magnetic field generated by digit current 226 rather than a direct interaction with the electron flow in digit current 226.

In practice, MRAM cell 200 may employ alternative and/or additional elements, and one or more of the elements depicted in FIG. 6 may be realized as a composite structure or combination of sub-elements. The specific arrangement of layers shown in FIG. 6 merely represents one suitable embodiment of the invention.

The spin-transfer effect is known to those skilled in the art. Briefly, a current becomes spin-polarized after the electrons pass through the first magnetic layer in a magnet/non-magnet/magnet trilayer structure, where the first magnetic layer is substantially thicker than the second magnetic layer. The spin-polarized electrons cross the nonmagnetic spacer and then, through conservation of angular momentum, place a torque on the second magnetic layer, which switches the magnetic orientation of the second layer to be parallel to the magnetic orientation of the first layer. If a current of the opposite polarity is applied, the electrons instead pass first through the second magnetic layer. After crossing the nonmagnetic spacer, a torque is applied to the first magnetic layer. However, due to its larger thickness, the first magnetic layer does not switch. Simultaneously, a fraction of the electrons will then reflect off the first magnetic layer and travel back across the nonmagnetic spacer before interacting with the second magnetic layer. In this case, the spin-transfer torque acts so as to switch the magnetic orientation of the second layer to be anti-parallel to the magnetic orientation of the first layer. Spin-transfer as described so far involves transmission of the current across all layers in the structure. Another possibility is spin-transfer reflection mode switching. In reflection mode, the current again becomes spin-polarized as the electrons pass through the first magnetic layer. The electrons then cross the nonmagnetic spacer layer, but instead of also crossing the second magnetic layer, the electrons follow a lower resistance path through an additional conductor leading away from the interface between the nonmagnetic spacer and the second magnetic layer. In the process, some fraction of the electrons will reflect off this interface and thereby exert a spin-transfer torque on the second magnetic layer to align it parallel to the first magnetic layer.

Data can be selectively written to MRAM cell 200 using spin-transfer reflection mode switching. Selectivity is achieved by the dependence of the spin-transfer switching current (carried by first conductor 202 and identified as write current 224 in FIG. 6) on the relative angle between the magnetizations of magnetic polarizer 204 and free magnetic element 208. Research by the inventors has shown that the magnitude of the spin-transfer switching current is smallest when the magnetizations of magnetic polarizer 204 and free magnetic element 208 are parallel or anti-parallel and largest when the magnetizations are orthogonal. This characteristic is described in Mancoff et al., ANGULAR DEPENDENCE OF SPIN-TRANSFER SWITCHING IN A MAGNETIC NANOSTRUCTURE, Applied Physics Letters, Vol. 25, No. 8, 1596–98 (Aug. 25, 2003). The content of this publication is incorporated by reference herein. As mentioned above, MRAM cell 200 employs anisotropy in magnetic polarizer 204 and free magnetic element 208 such that their respective magnetic orientations are orthogonal in the default or natural state.

Figure 7:
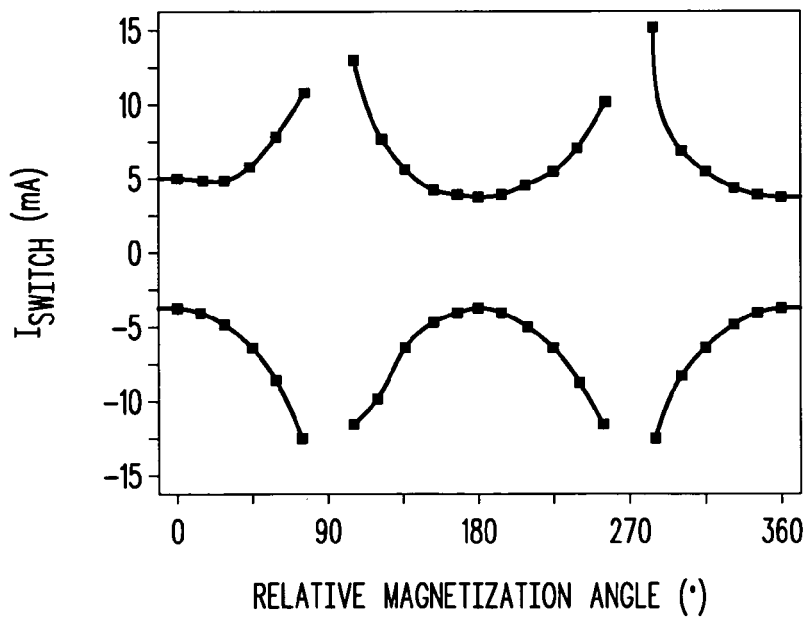
FIG. 7 is a graph of write switching current versus relative magnetization angle between the magnetization of a polarizer and the magnetization of a free magnetic element.

FIG. 7 is a graph of write switching current versus relative magnetization angle between the magnetization of a polarizer and the magnetization of a free magnetic element. As shown in this graph, the switching current reaches a minimum of about 5 mA at angles of 0° and 180°, i.e., when the magnetic orientations are parallel or anti-parallel. In contrast, the switching current diverges for orthogonal orientations, towards 90° and 270°, with an increase greater than a factor of two. The MRAM cells and devices described herein take advantage of this angular dependence to provide enhanced switching performance.

Application of digit current 226 to second conductor 216 creates a magnetic field that will rotate the magnetic orientation of magnetic polarizer 204 such that it becomes parallel or anti-parallel to the magnetic orientation of free magnetic element 208. In this regard, second conductor 216 serves as a conducting digit line for providing digit current 226 for changing the orientation of the variable magnetization in magnetic polarizer 204. Digit current 226 causes the orientation of the magnetization in magnetic polarizer 204 to become misaligned (e.g., orthogonal) with the easy axis of magnetic polarizer 204. Thus, the magnetic orientation of free magnetic element 208 can be switched in response to the application of write current 224 to first conductor 202 because the required spin-transfer current is low when the magnetizations of these elements are parallel or anti-parallel compared to when they are orthogonal. The electrons in the write current 224 (the arrow represents the direction of the electron flow) become spin-polarized as they pass through magnetic polarizer 204. The polarized spin-transfer write current 224, which cannot flow through MRAM cell 200 due to the high resistivity insulator 210, flows through spacer element 206 and back to first conductor 202. While in spacer element 206, a significant portion of the electrons in write current 224 reflect off free magnetic element 208 (as depicted in FIG. 6) and exerts a spin-transfer torque that attempts to align the magnetic orientation of free magnetic element 208 with the magnetic orientation of magnetic polarizer 204.

The other MRAM cells that share the first conductor 202 will not switch in response to the write current 224 because their free magnetic elements and magnetic polarizers remain orthogonal, thus requiring a high spin-transfer switching current. The other MRAM cells that share the second conductor 216 will experience a magnetic field from the common digit current 226, with a resulting change in the magnetization of the magnetic polarizers. The free magnetic elements in these other MRAM cells, however, will not switch because no write current is applied to the cells. Consequently, only the designated bit at the intersection of the specified write line (e.g., first conductor 202) and the specified digit line (e.g., second conductor 216) will be selectively switched.

Figure 8:
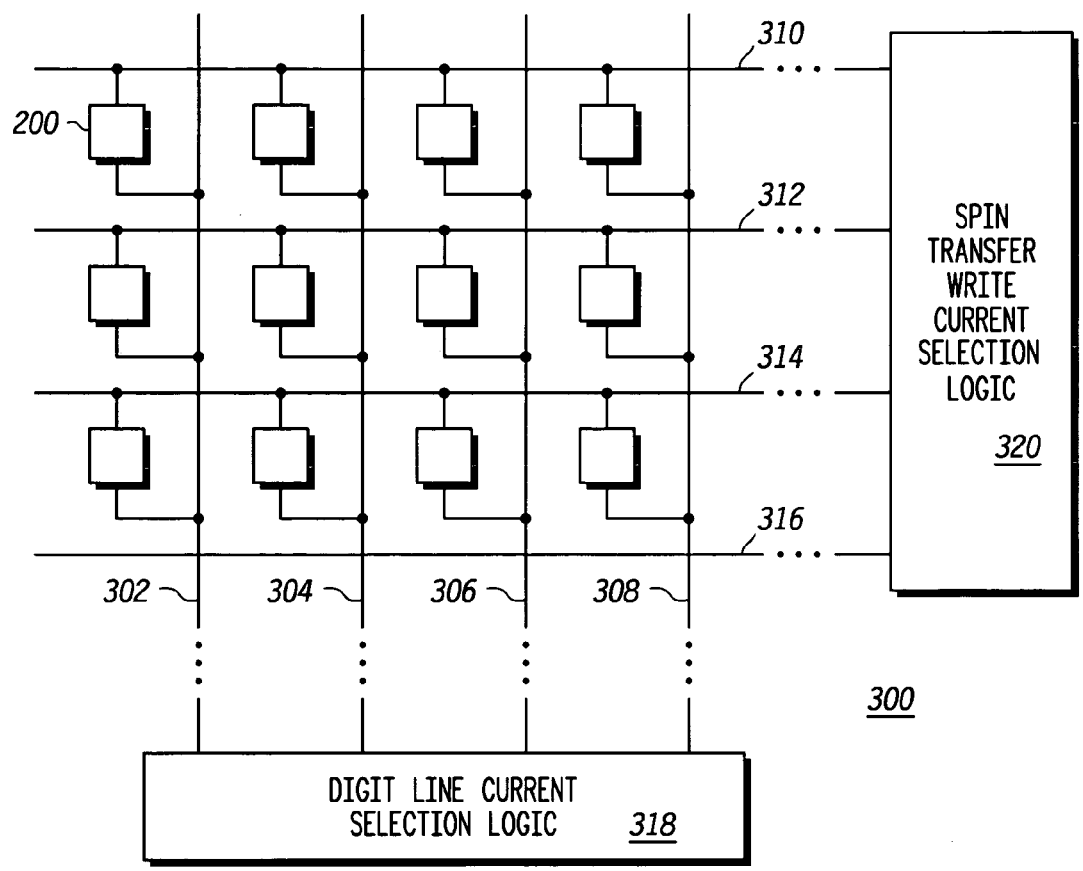
FIG. 8 is a schematic representation of an MRAM array.

A practical MRAM architecture may include an array or matrix of MRAM cells 200 having individual write selectivity as described herein. FIG. 8 is a schematic representation of an example MRAM array 300 that may employ any number of MRAM cells 200. The ellipses in FIG. 8 indicate that the MRAM array 300 can include any number of rows and any number of columns. In this example, cells in a given column share a common digit line (identified by reference numbers 302, 304, 306, and 308), and cells in a given row share a common write line (identified by reference numbers 310, 312, 314, and 316). MRAM array 300 may also include logic 318 that controls the selection and/or application of digit line current, and logic 320 that controls the selection and/or application of write line current. These control elements are suitably configured to selectively apply digit line current and write line current to the appropriate column and row, respectively, to facilitate writing of data into the designated MRAM cell 200.

Figure 9:
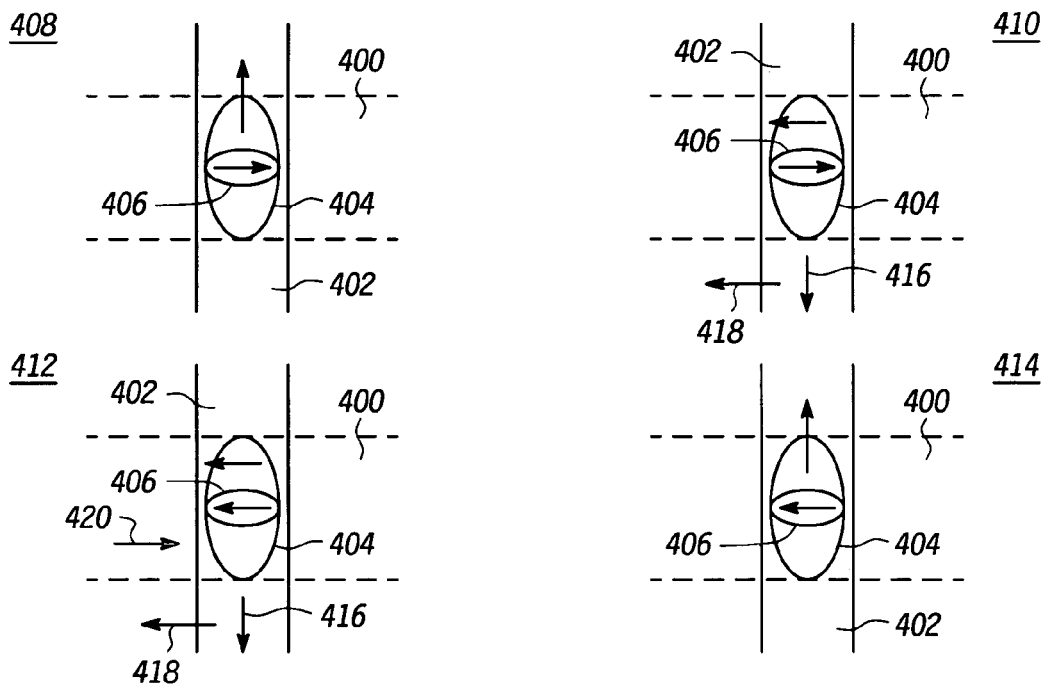
FIG. 9 is a schematic representation of an MRAM writing technique according to the invention.

FIG. 9 is a schematic representation of an MRAM writing technique according to the invention. FIG. 9 depicts a top view of an MRAM cell, such as MRAM cell 200, at different times during the writing of data to the cell. FIG. 9 schematically depicts a spin-transfer write line 400 (identified by dashed lines), a digit line 402 (identified by solid lines), a magnetic polarizer 404 (the large oval), and a free magnetic element 406 (the small oval). FIG. 9 includes views of a first state 408, a second state 410, a third star 412, and a fourth state 414.

First state 408 represents the natural, default, or starting state of the MRAM cell. In this state, the magnetic orientation of magnetic polarizer 404 is orthogonal to the magnetic orientation of free magnetic element 406. For first state 408, the arrow pointing up indicates the magnetic orientation of magnetic polarizer 404 and the arrow pointing to the right indicates the magnetic orientation of free magnetic element 406. In first state 408, the magnetic orientation of magnetic polarizer 404 is aligned with the easy axis of magnetic polarizer 404, and the magnetic orientation of free magnetic element 406 is aligned with the easy axis of free magnetic element 406.

Second state 410 represents the state of the MRAM cell when a current 416 (in the direction of the arrow) is applied to digit line 402. Current 416 generates a magnetic field 418 (which points in the direction of the arrow), which is present in the location of magnetic polarizer 404. Magnetic field 418 forces the magnetic orientation of magnetic polarizer 404 off its easy axis and in alignment with magnetic field 418. In this regard, the magnetic orientation of magnetic polarizer 404 in second state 410 points to the left. In this state, the magnetic orientation of free magnetic element 406 is anti-parallel to the magnetic orientation of magnetic polarizer 404. Accordingly, the threshold for current-induced switching is low, compared to when the magnetizations are orthogonal. Because the free magnetic element 406 will be switched by the more efficient mechanism of spin-transfer, the coercivity of the free element 406 can be made sufficiently large, such as by use of a material with a high magnetocrystalline anisotropy, so that the magnetization of the free element 406 will not be significantly affected by the magnetic field 418. In addition, the free element 406 as shown will be patterned to a smaller size than the polarizer 404, so that the increased magnetostatic shape anisotropy of the free element compared to the polarizer also helps its magnetization to not be affected by the magnetic field 418.

Third state 412 represents the state of the MRAM cell when a current 420 (with the electron flow in the direction of the arrow) is applied to write line 400. In this state, current 416 is still being applied to digit line 402. Due to the low spin-transfer switching threshold associated with second state 410, the magnetic orientation of free magnetic element 406 switches to become parallel to the magnetic orientation of magnetic polarizer 404. Accordingly, the magnetic orientation of free magnetic element 406 points to the left in the depiction of third state 412. This assumes that the direction of magnetization for the polarizer 404 in third state 412 remains unaffected by the spin-transfer torque exerted on it by the current 420. In practice, this result can be achieved by making the polarizer thickness grater than the free layer thickness, for example by a factor of 1.5 to 2 or more. In that case, the spin-transfer current 420 will be sufficiently large to switch the thinner free layer 406 magnetization to be parallel to the polarizer 404 magnetization, but the spin-transfer torque exerted on the thicker polarizer layer will not disturb its magnetization.

Fourth state 414 represents the state of the MRAM cell after current 416 and current 420 are removed from the respective conductive lines. Removal of current 416 enables the magnetic orientation of magnetic polarizer 404 to return to the easy axis of magnetic polarizer 404. In other words, magnetic polarizer 404 returns to its natural or default condition. The magnetic orientation of free magnetic element 406, however, remains stable in the switched state (pointing to the left in FIG. 9), which is opposite to its original state.

Once the current 416 has been removed, the magnetization of magnetic polarizer 404 relaxes to either its original easy axis direction (top of the page in FIG. 9) or the opposite easy axis direction (bottom of the page in FIG. 9). Which of the two easy axis directions the polarizer magnetization reaches is not important because subsequent application of a digit line current 416 can rotate the polarizer magnetization equally easily from either easy axis direction. Having switched the free magnetic element 406 from right to left in FIG. 9, the free element can be switched again from left to right using the same sequence but with either the opposite polarity for the digit line 416 current or the write current 420. In the first case, if the digit line current polarity is reversed, the resulting magnetic field will rotate the polarizer magnetization to the right in FIG. 9. Then, when a write current flowing from left to right in FIG. 9 is applied, spin-transfer will again switch the free magnetization to be parallel to the polarizer, so the free magnetization will be switched to the right. In the second case, the digit line current polarity is kept the same as in FIG. 9, so the resulting magnetic field rotates the polarizer to the left. The write current polarity is then reversed compared to FIG. 9, so that spin-transfer will switch the free magnetization to be anti-parallel to the polarizer, and the free magnetization will be switched to the right. Thus, in order to switch bits from one direction to the other and back, the polarity of only either the digit line current or the write line current needs to be reversed but not both. In practice, changing the polarity of the write line current while keeping constant the polarity of the digit line current may be preferred due to greater consistency with conventional MRAM design.

Figure 10:
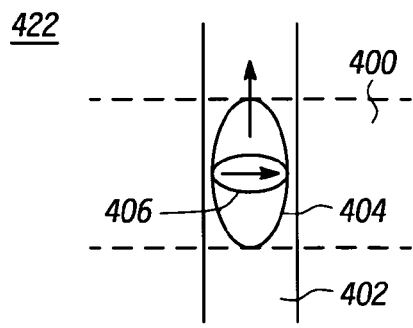
FIG. 10 is a schematic representation of the application of a write current to an MRAM cell in the absence of a digit current, in accordance with the invention.
Figure 10:
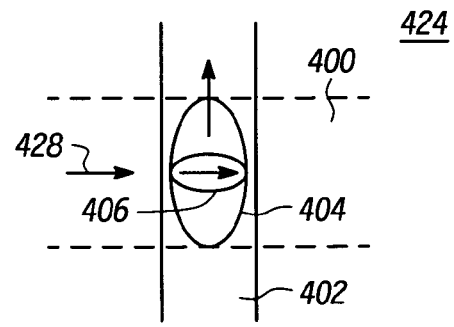
Figure 10:
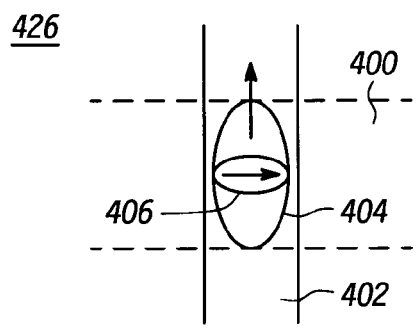

Notably, the combination of both current 416 and current 420 is required to write data to the MRAM cell. Neither current 416 nor current 420 alone is sufficient for writing. FIG. 10 is a schematic representation of the application of a write current to an MRAM cell in the absence of a digit current. FIG. 10 includes views of a first state 422, a second state 424, and a third state 426. First state 422 is equivalent to first state 408 shown in FIG. 9, i.e., first state 422 is the natural starting state of the cell.

Second state 424 represents the state of the MRAM cell when a current 428 (with the electron flow in the direction of the arrow) is applied to write line 400 in the absence of current on digit line 402. In this state, the magnetic orientation of free magnetic element 406 is orthogonal to the magnetic orientation of magnetic polarizer 404. Consequently, the threshold for spin-transfer switching is high and, therefore, the magnetic orientation of free magnetic element 406 does not switch because the write current 428 does not exceed the high switching current threshold. In this regard, the magnetic orientation of free magnetic element 406 remains pointing to the right in the depiction of second state 424. Third state 428 represents the state of the MRAM cell after current 428 is removed. In this state, the magnetic orientation of free magnetic element 406 remains stable in the original un-switched condition (pointing to the right in FIG. 10).

Figure 11:
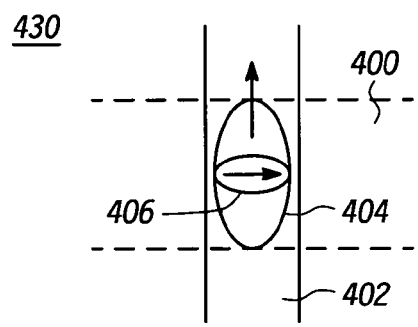
FIG. 11 is a schematic representation of the application of a digit current to an MRAM cell in the absence of a write current, in accordance with the invention.
Figure 11:
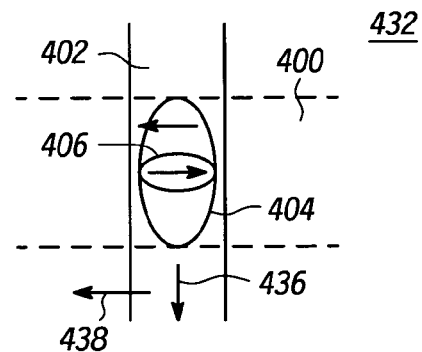
Figure 11:
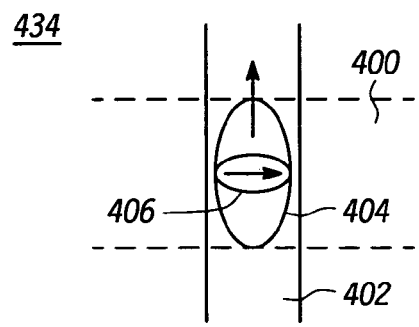

FIG. 11 is a schematic representation of the application of a digit current to an MRAM cell in the absence of a write current. FIG. 11 includes views of a first state 430, a second state 432, and a third state 434. First state 430 is equivalent to first state 408 shown in FIG. 9, i.e., first state 430 is the natural starting state of the cell.

Second state 432 represents the state of the MRAM cell when a current 436 (in the direction of the arrow) is applied to digit line 400 in the absence of current on write line 402. Second state 432 is equivalent to second state 410 shown in FIG. 9. In this state, current 436 generates a magnetic field 438 having an orientation as indicated by the arrow. The lack of a spin-transfer write current, however, causes the magnetic orientation of free magnetic element 406 to remain stable in its original condition. Third state 434 represents the state of the MRAM cell after current 436 is removed. In this state, the magnetic orientation of free magnetic element 406 remains stable in the original un-switched condition (pointing to the right in FIG. 11).

The advantages of the switching technique described herein include the ability to write a bit with a large coercivity, approaching 1 kOe in terms of field-induced switching, by using an applied current of less than approximately 5 mA (which is modest relative to conventional MRAM switching). Such a large coercivity bit offers increased thermal stability and less possibility for bit disturbs. Because of the ability to use a bit with such a large coercivity, the possibility of unintentionally disturbing the free layer while applying the digit line current to rotate the polarizer is relatively small. Thus, the amount of bit disturbs associated with the set of digit lines will be minimal, compared to conventional MRAM in which both of the sets of magnetic field write lines can produce bit disturbs.

Figure 12:
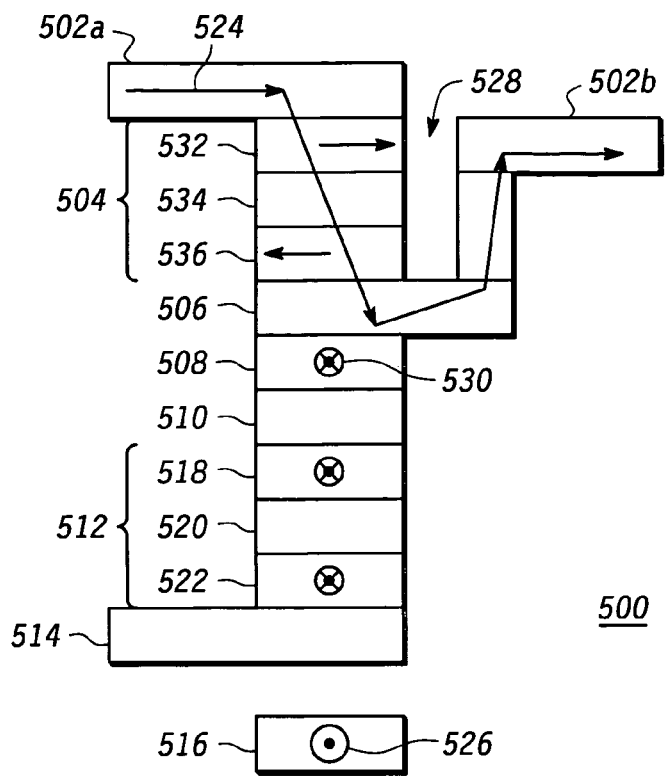
FIG. 12 is a side sectional view of an MRAM cell configured in accordance with another embodiment of the invention.

FIG. 12 is a side sectional view of an MRAM cell 500 configured in accordance with another embodiment of the invention. MRAM cell 500 employs a synthetic antiferromagnet polarizer 504 in lieu of the magnetic polarizer of MRAM cell 200. MRAM cell 500 generally includes the following elements: a first conductor 502 serving as a write current line; polarizer 504; a spacer element 506; a free magnetic element 508; an insulator 510; a fixed magnet element 512; an electrode 514; and a second conductor 516 serving as a digit current line. In this example embodiment, fixed magnet element 512 includes a fixed magnetic layer 518, a spacer layer 520, and a fixed magnetic layer 522. Many of the components of MRAM cell 500 are equivalent to counterpart components in MRAM cell 200 and, therefore, portions of the above description of MRAM cell 200 also apply to MRAM cell 500.

In the example embodiment, polarizer 504 is located between first conductor 502 and spacer element 506. Polarizer 504 can be realized as a synthetic antiferromagnet having a first magnetic polarizer layer 532, a spacer layer 534, and a second magnetic polarizer layer 536. First magnetic polarizer layer 532 and second magnetic polarizer layer 536 each have a variable magnetization. In the default natural state, first magnetic polarizer layer 532 and second magnetic polarizer layer 536 have anti-parallel magnetizations (for example, to the right and to the left as depicted in FIG. 12 for polarizer layers 532 and 536, respectively). First magnetic polarizer layer 532 and second magnetic polarizer layer 536 may be formed from any suitable magnetic material, such as at least one of the elements Ni, Fe, Mn, Co, or their alloys as well as so-called half-metallic ferromagnets such as NiMnSb, PtMnSb, $Fe_3O_4$, or $CrO_2$. Spacer layer 534 is formed from any suitable nonmagnetic material, including at least one of the elements Ru, Os, Re, Cr, Rh, Cu, or their combinations. Synthetic antiferromagnet structures are known to those skilled in the art and, therefore, will not be described in detail herein. Also, as shown in FIG. 12, the easy axes of the free magnetic layer 508 and the fixed magnetic layers 518 and 522 are pointing either into or out of the page (represented by the respective symbols in FIG. 12).

Figure 13:
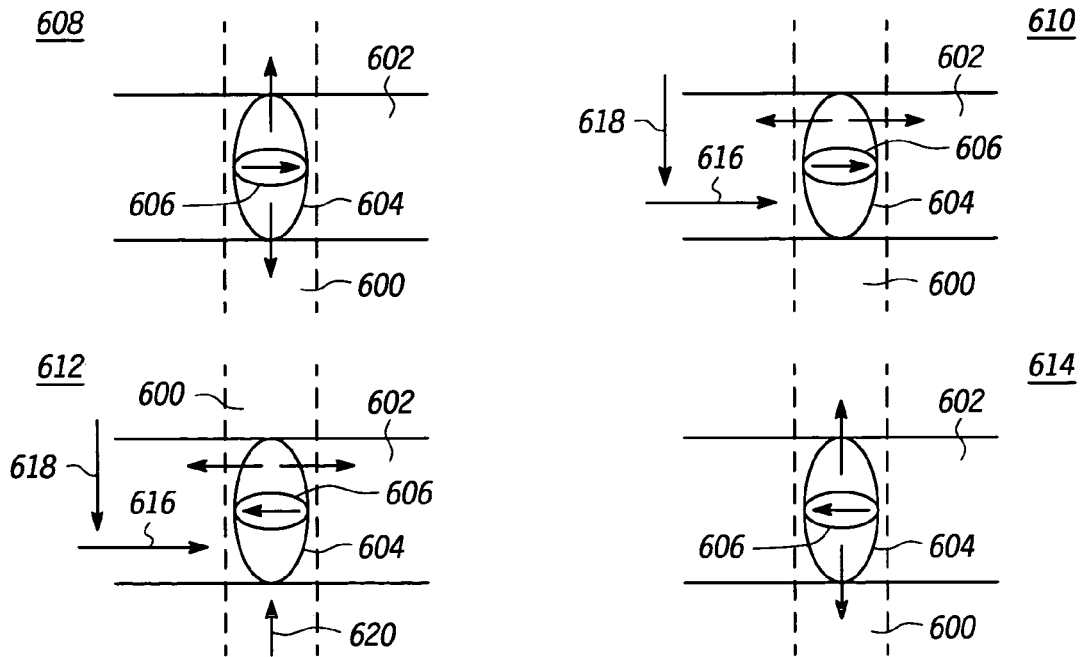
FIG. 13 is a schematic representation of an MRAM writing technique according to the invention.

FIG. 13 is a schematic representation of an MRAM writing technique according to the invention. FIG. 13 depicts a top view of an MRAM cell, such as MRAM cell 500, at different times during the writing of data to the cell. FIG. 13 schematically depicts a spin-transfer write line 600 (identified by dashed lines), a digit line 602 (identified by solid lines), a magnetic polarizer 604 (the large oval) having two polarizing elements as described above, and a free magnetic element 606 (the small oval). FIG. 13 includes views of a first state 608, a second state 610, a third state 612, and a fourth state 614.

First state 608 represents the natural, default, or starting state of the MRAM cell. In this state, the magnetic orientations of the two magnetic polarizers are anti-parallel to each other (pointing up and down in FIG. 13). The magnetic orientations of the two magnetic polarizers are orthogonal to the magnetic orientation of free magnetic element 606. For first state 608, the arrow pointing to the right indicates the magnetic orientation of free magnetic element 606. In first state 608, the magnetic orientations of the two magnetic polarizers are aligned with the easy axis of magnetic polarizer 604, and the magnetic orientation of free magnetic element 606 is aligned with the easy axis of free magnetic element 606.

Second state 610 represents the state of the MRAM cell when a current 616 (in the direction of the arrow) is applied to digit line 602. Current 616 generates a magnetic field 618 (which points in the direction of the arrow), which is present in the location of magnetic polarizer 604. Magnetic field 618 causes a spin-flop transition in magnetic polarizer 604 such that the magnetic orientations of the two magnetic polarizers become orthogonal to the easy axis and anti-parallel to each other. The spin-flop transition occurs as a way of minimizing the system's total energy, including the anti-parallel coupling of the synthetic antiferromagnet, the magnetostatic shape anisotropy, and the Zeeman energy of the magnetic field interacting with the magnetic moments in the polarizer. The state following the spin-flop in state 610 maintains the strong anti-parallel coupling of the synthetic antiferromagnet while not requiring either of its layers to be completely anti-parallel to the magnetic field. In this regard, the magnetic orientations of the magnetic polarizers in second state 610 point approximately to the right and to the left as shown. One is parallel to the magnetic orientation of free magnetic element 606, and the other is anti-parallel to the magnetic orientation of free magnetic element 606. The application of current 616 alone does not affect the magnetic orientation of free magnetic element 606. In practice, there will be a slight deviation of the magnetic polarizers from parallel or anti-parallel to the magnetic orientation of free magnetic element 606. The synthetic antiferromagnet has minimum energy when the layers scissor, so that their magnetization points slightly in the direction of the magnetic field 618. The deviation from parallel can be made to be small by using a synthetic antiferromagnet with sufficiently strong antiferromagnetic coupling.

Third state 612 represents the state of the MRAM cell when a current 620 (in the direction of the arrow) is applied to write line 600. In this state, current 616 is still being applied to digit line 602. Current 620 switches the orientation of free magnetic element 606 (from pointing to the right to pointing to the left in FIG. 13) because the spin-transfer switching threshold is low for parallel and anti-parallel magnetizations. Accordingly, the magnetic orientation of free magnetic element 606 points to the left in the depiction of third state 612. In this case, the second magnetic polarizer layer 536, which is the one closer to the free layer and therefore dominates the direction of the spin-transfer torque, is the component of the magnetic polarizer 604 which has its magnetization to the left in FIG. 13.

Fourth state 614 represents the state of the MRAM cell after current 616 and current 620 are removed from the respective conductive lines. Removal of current 616 enables the magnetic orientations of the two magnetic polarizers to return to the easy axis of magnetic polarizer 604 and anti-parallel to each other. In other words, magnetic polarizer 604 returns to its natural or default condition. The magnetic orientation of free magnetic element 606, however, remains stable in the switched state (pointing to the left in FIG. 13), which is opposite to its original state. In order to switch the bit again in the opposite direction, either the same digit line current polarity can be applied with the opposite spin-transfer write current polarity, or the opposite digit line current polarity can be applied with the same spin-transfer write current polarity. In practice, changing the polarity of the write line current while keeping constant the polarity of the digit line current may be preferred due to greater consistency with conventional MRAM design.

One advantage of MRAM cell 500 versus MRAM cell 200 is that, as the device is scaled to smaller sizes, the spin-flop transition field of the two magnetic polarizers can be kept low by reducing the saturation field strength of the antiferromagnetic coupling between the two magnetic polarizers. This trend is in contrast to MRAM cell 200, where the reorientation field of the magnetic polarizer will increase at smaller device sizes due to the increase in the magnetostatic shape anisotropy field.

Figure 14:
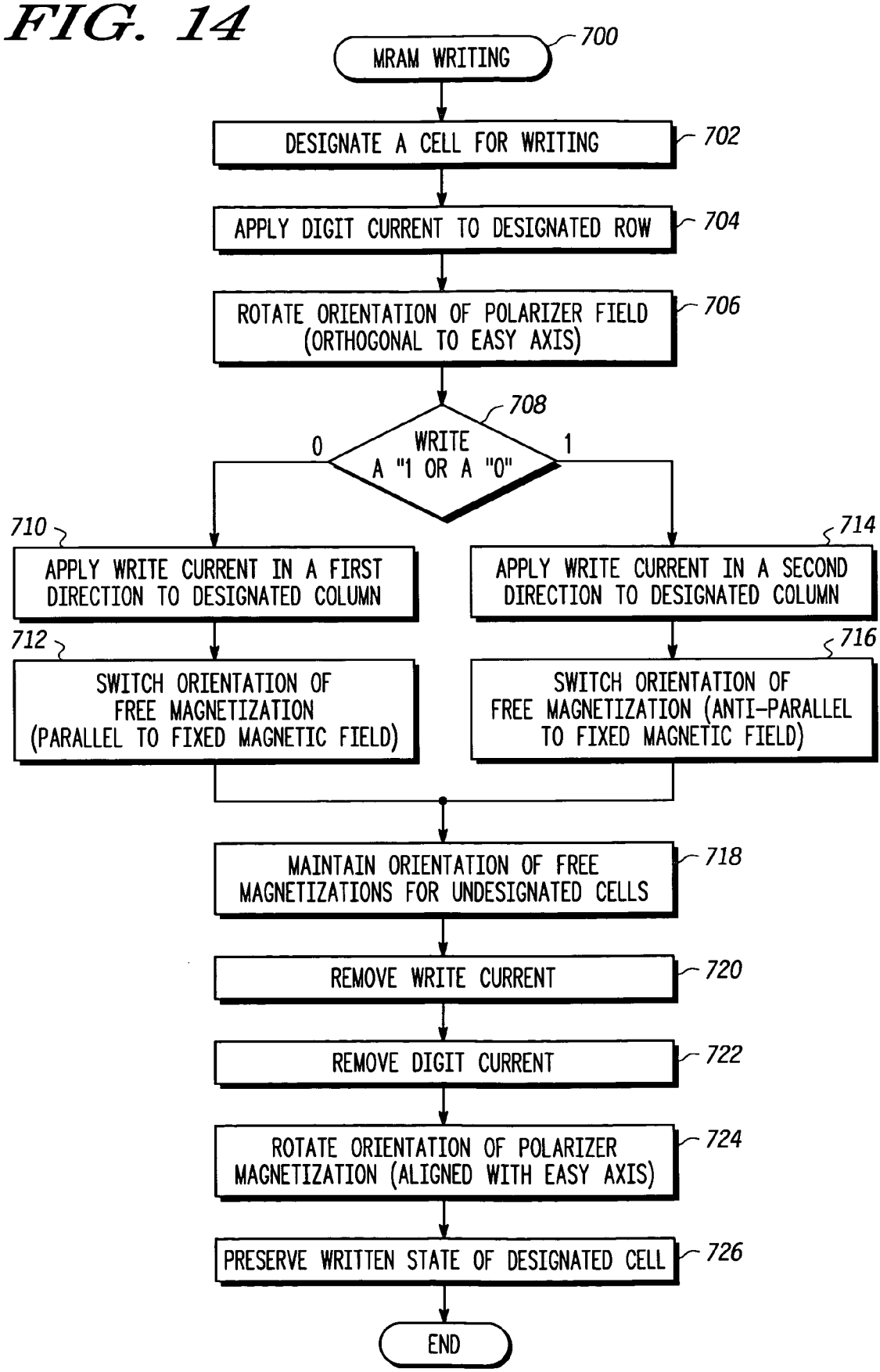
FIG. 14 is a flow chart of an MRAM writing process according to the invention.

FIG. 14 is a flow chart of an MRAM writing process 700 that may be performed when writing data to an MRAM array that includes MRAM cells 200 as described herein. Process 700 may be performed and/or controlled by one or more logic and/or processor elements (see, for example, FIG. 8) such as those found in computer systems. In a practical implementation, process 700 may include any number of additional and/or alternative tasks, and process 700 may be incorporated into a more complex memory control read/write procedure. Furthermore, the tasks depicted in process 700 need not be performed in the order shown in FIG. 14 and one or more of the tasks may be performed concurrently in a practical embodiment.

MRAM writing process 700 begins with a task 702, which designates an MRAM cell in the MRAM array for writing. In a typical "two dimensional" MRAM array, task 702 may identify a row and a column to designate the MRAM cell. Once the MRAM cell is designated, a digit current is applied to a row of MRAM cells (task 704); this row includes the designated MRAM cell. In practice, the digit current is common to all MRAM cells in the designated row. In response to the digit current, the orientation of the polarizer magnetization for the designated MRAM cell is rotated (task 706). The orientation of the polarizer field is rotated from being aligned with the easy axis of the magnetic polarizer to being orthogonal to the easy axis of the magnetic polarizer. In the example embodiment, this switching occurs for each MRAM cell in the designated row because the digit current is common to the row. The magnitude of the digit current is high enough to cause the switching of the polarizer magnetization, yet low enough to not affect the magnetic orientation of the free magnetic elements in the MRAM cells contained in the MRAM array.

The switching of the polarizer field makes it possible to selectively write data to the designated MRAM cell using a relatively modest write current. If a "0" bit is to be written (query task 708), then MRAM writing process 700 applies a write current in a first direction to a column of MRAM cells (task 710); this column includes the designated MRAM cell. In the practical embodiment, task 710 applies the write current to each of the MRAM cells in the designated column. In response to the write current, the orientation of the magnetization for the free magnetic element in the designated MRAM cell is switched to a written state (task 712). The switching represented by task 712 occurs as a result of the application of the write current to the designated column. Consequently, the MRAM array maintains the original orientations of the magnetizations for the free magnetic elements in the undesignated MRAM cells in the column. In this manner, only the data in the designated MRAM cell is selectively written. The orientation of the magnetization for the free magnetic element in the designated MRAM cell is switched to become parallel to the orientation of the magnetization for the fixed magnetic element in the designated MRAM cell.

If a "1" bit is to be written (query task 708), then MRAM writing process 700 applies a write current in a second direction to the column of MRAM cells (task 714). In the practical embodiment, task 714 applies the write current to each of the MRAM cells in the designated column. In response to the write current, the orientation of the magnetization for the free magnetic element in the designated MRAM cell is switched to a written state (task 716). The switching represented by task 716 occurs as a result of the application of the write current to the designated column. Consequently, the MRAM array maintains the original orientations of the magnetizations for the free magnetic elements in the undesignated MRAM cells in the column. In this manner, only the data in the designated MRAM cell is selectively written. The orientation of the magnetization for the free magnetic element in the designated MRAM cell is switched to become anti-parallel to the orientation of the magnetization for the fixed magnetic element in the designated MRAM cell.

As mentioned above, the selective writing technique of MRAM writing process 700 maintains the orientation of the free magnetic elements for all of the undesignated MRAM cells (task 718). After the data is written to the designated MRAM cell, the write current can be removed from the spin-transfer write line (task 720) and the digit current can be removed from the digit line (task 722). The removal of the digit current causes the orientation of the magnetizations for the magnetic polarizers to return to their natural states, i.e., they again become aligned with the magnetic easy axes of the magnetic polarizers (task 724). The rotation of the magnetization represented by task 724 is responsive to the removal of the digit current. The removal of these currents is desirable to preserve the written state of the SAM cells in the array (task 726) until a subsequent write operation changes the data in the cells. In this regard, the preservation of the written state results from the removal of the write and digit currents. As described, the MRAM writing process 700 in FIG. 14 involves applying a digit line current of a constant polarity and reversing the polarity of the spin-transfer write current as needed to write a "0" or "1" bit. As mentioned previously, an alternate approach is to apply a spin-transfer write current of a constant polarity and instead reverse the polarity of the digit line current as needed to write a "0" or a "1" bit.

An MRAM writing process similar to process 700 can be utilized to write data to an MRAM array that includes a plurality of MRAM cells 500 as described above in connection with FIG. 12 and FIG. 13.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A magnetic random access memory ("MRAM") device comprising:
   a magnetic polarizer having a first variable magnetization;
   a conducting digit line configured to provide a digit current that alters an orientation of said first variable magnetization;
   a free magnetic element having a second variable magnetization; and
   a conducting spacer element between said magnetic polarizer and said free magnetic element.

2. An MRAM device according to claim 1, wherein said free magnetic element is selectively programmed using angular dependence of spin-transfer interaction with said magnetic polarizer.

3. An MRAM device according to claim 1, further comprising a conducting digit line for providing a digit current for switching orientation of said first variable magnetization.

4. An MRAM device according to claim 1, wherein:
   said magnetic polarizer comprises a first magnetic easy axis; and
   said free magnetic element comprises a second magnetic easy axis orthogonal to said first magnetic easy axis.

5. An MRAM device according to claim 4, wherein application of said digit current to said conducting digit line causes orientation of said first variable magnetization to become misaligned with said first magnetic easy axis.

6. An MRAM device according to claim 5, wherein application of said digit current to said conducting digit line causes orientation of said first variable magnetization to become orthogonal to said first magnetic easy axis.

7. An MRAM device according to claim 1, further comprising:
   a fixed magnet element; and
   a tunnel barrier element between said free magnetic element and said fixed magnet element.

8. An MRAM device according to claim 1, further comprising a conducting write line for providing a spin-transfer write current to said magnetic polarizer.

9. An MRAM device according to claim 1, wherein said magnetic polarizer comprises:
- a first polarizer element having said first variable magnetization and a first magnetic easy axis; and
- a second polarizer element having a third variable magnetization and said first magnetic easy axis, said third variable magnetization being anti-parallel to said first variable magnetization in a default condition.

10. An MRAM device according to claim 9, further comprising a conducting digit line for providing a digit current for switching orientation of said third variable magnetization off of said first magnetic easy axis.

11. An MRAM device according to claim 10, wherein said digit current switches orientation of said first variable magnetization and said third variable magnetization such that said first variable magnetization is anti-parallel to said third variable magnetization.

12. A magnetic random access memory ("MRAM") device comprising:
- a magnetic polarizer having a first variable magnetization and a first magnetic easy axis that defines a natural orientation of said first variable magnetization;
- a free magnetic element having a second variable magnetization and a second magnetic easy axis that defines a natural orientation of said second variable magnetization, said second magnetic easy axis being orthogonal to said first magnetic easy axis; and
- a conducting spacer element between said magnetic polarizer and said free magnetic element.

13. An MRAM device according to claim 12, wherein the free magnetic element is selectively programmed using angular dependence of spin-transfer interaction with said magnetic polarizer.

14. An MRAM device according to claim 12, further comprising a conductor for providing a current for switching orientation of said first variable magnetization off of said first magnetic easy axis.

15. An MRAM device according to claim 14, wherein application of said current to said conductor switches orientation of said first variable magnetization to become orthogonal to said first magnetic easy axis.

16. An MRAM device according to claim 14, further comprising:
- a fixed magnet element; and
- a tunnel barrier element between said free magnetic element and said liked magnet element.

17. An MRAM device according to claim 14, further comprising a second conductor for providing a spin-transfer write current to said magnetic polarizer.

18. An MRAM device according to claim 14, wherein said magnetic polarizer comprises:
- a first polarizer element having said first magnetization and said first magnetic easy axis;
- a second polarizer element having a third magnetization and said first magnetic easy axis, said third magnetization being anti-parallel to said first magnetization in a default condition.

19. An MRAM device according to claim 18, wherein said current switches orientation of said third variable magnetization off of said first magnetic easy axis.

20. An MRAM device according to claim 19, wherein said current switches orientation of said first variable magnetization and said third variable magnetization such that said first variable magnetization is anti-parallel to said third variable magnetization.

* * * * *